(12) United States Patent
Tian

(10) Patent No.: US 11,869,794 B2
(45) Date of Patent: Jan. 9, 2024

(54) LONG-LIFE EXTENDED TEMPERATURE RANGE EMBEDDED DIODE DESIGN FOR ELECTROSTATIC CHUCK WITH MULTIPLEXED HEATERS ARRAY

(71) Applicant: LAM RESEARCH CORPORATION, Fremont, CA (US)

(72) Inventor: Siyuan Tian, Newark, CA (US)

(73) Assignee: Lam Research Corporation, Fremont, CA (US)

(*) Notice: Subject to any disclaimer, the term of this patent is extended or adjusted under 35 U.S.C. 154(b) by 383 days.

(21) Appl. No.: 17/298,984

(22) PCT Filed: Dec. 4, 2019

(86) PCT No.: PCT/US2019/064424
§ 371 (c)(1),
(2) Date: Jun. 2, 2021

(87) PCT Pub. No.: WO2020/117911
PCT Pub. Date: Jun. 11, 2020

(65) Prior Publication Data
US 2022/0068691 A1 Mar. 3, 2022

Related U.S. Application Data

(60) Provisional application No. 62/776,654, filed on Dec. 7, 2018.

(51) Int. Cl.
*H01L 21/40* (2006.01)
*H01L 21/683* (2006.01)
(Continued)

(52) U.S. Cl.
CPC .... *H01L 21/6833* (2013.01); *H01J 37/32715* (2013.01); *H01L 24/40* (2013.01);
(Continued)

(58) Field of Classification Search
CPC .......... H01J 37/32715; H01L 21/6833; H01L 24/40; H01L 24/48; H01L 2224/37147;
(Continued)

(56) References Cited

U.S. PATENT DOCUMENTS 6,307,755 B1 10/2001 Williams et al.
8,461,674 B2 * 6/2013 Gaff ..................... H01L 21/0201
257/14

(Continued)

FOREIGN PATENT DOCUMENTS

KR 100809940 B1 3/2008

OTHER PUBLICATIONS

International Search Report and Written Opinion of the ISA issued in PCT/US2019/064424, dated Mar. 24, 2020; ISA/KR.

*Primary Examiner* — Adolf D Berhane

(57) ABSTRACT

A substrate support for a plasma chamber includes a base plate arranged along a plane, a first layer of an electrically insulating material arranged on the base plate along the plane, a plurality of heating elements arranged in the first layer along the plane, and a plurality of diodes arranged in respective cavities in the first layer. The plurality of diodes are connected in series to the plurality of heating elements, respectively. Each of the plurality of diodes includes a die of a semiconductor material arranged in a respective one of the cavities. The semiconductor material has a first coefficient of thermal expansion. A first side of the die is arranged on the first layer along the plane. A first terminal of the die is connected to a first electrical contact on the first layer.

15 Claims, 16 Drawing Sheets

(51) Int. Cl.
*H01J 37/32* (2006.01)
*H01L 23/00* (2006.01)
(52) U.S. Cl.
CPC .... *H01L 24/48* (2013.01); *H01L 2224/37147* (2013.01); *H01L 2224/4005* (2013.01); *H01L 2224/40225* (2013.01); *H01L 2224/48091* (2013.01); *H01L 2224/48227* (2013.01); *H01L 2224/48647* (2013.01); *H01L 2224/49175* (2013.01)
(58) Field of Classification Search
CPC ... H01L 2224/4005; H01L 2224/40225; H01L 2224/48091; H01L 2224/48227; H01L 2224/48647; H01L 2224/49175
See application file for complete search history.

(56) References Cited

U.S. PATENT DOCUMENTS

| | | | |
|---|---|---|---|
| 2003/0075785 A1 | 4/2003 | Crowley et al. | |
| 2014/0154819 A1 | 6/2014 | Gaff et al. | |
| 2016/0300741 A1 | 10/2016 | Singh et al. | |
| 2023/0178407 A1* | 6/2023 | Tian | H01J 37/32724 118/728 |

* cited by examiner

| Option | FIGS. 3-6 | FIG. 7 | FIG. 8 | FIG. 9 |
|---|---|---|---|---|
| Strap | • Straight Cu strap connector | • New Cu strap to match Si diode & W-Cu plate stack height | • New Cu strap with extra bending and thinner thickness | • New Cu strap with extra bending<br>• Prevent formation of high stress point by preventing solder fm reaching diode edge |
| Intermediate CTE Structure | | • W-Cu plate<br>• Prevent formation of high stress point by preventing solder from reaching diode edge | | |
| Potting material | • Silicone based | • Silicone based | • Silicone based | • Epoxy based (low CTE) |
| Thermal Stress control | • Large CTE mismatch bet Cu and Si diode<br>• Large CTE mismatch bet silicone based potting and components | • W-Cu plate as intermediate material to reduce CTE mismatch between electronic components | • New Cu strap connector prevents formation of high stress point by preventing solder fm reaching diode edge | • Expoxy based potting material reduces CTE mismatch between electronic components |
| Effective of improvement | • 1x lifetime improvement<br>• 1x operating temp range | • >1x lifetime improvement<br>• >1x operating temp range | • >1x lifetime improvement<br>• >1x operating temp range | • >1x lifetime improvement<br>• >1x operating temp range |

FIG. 13

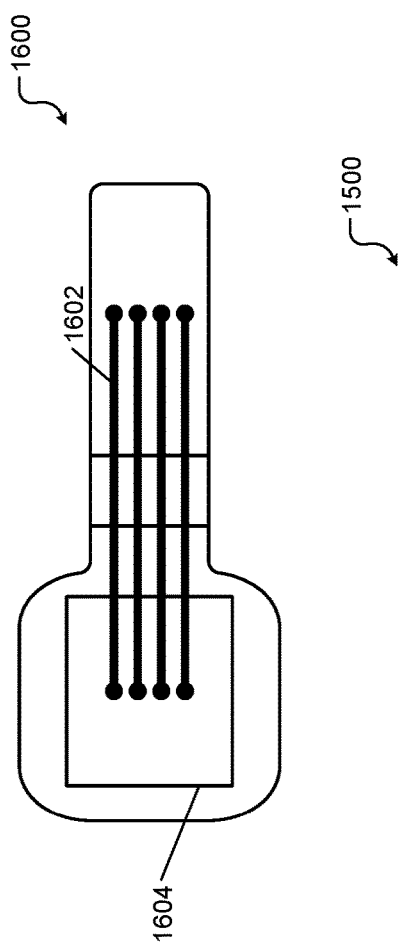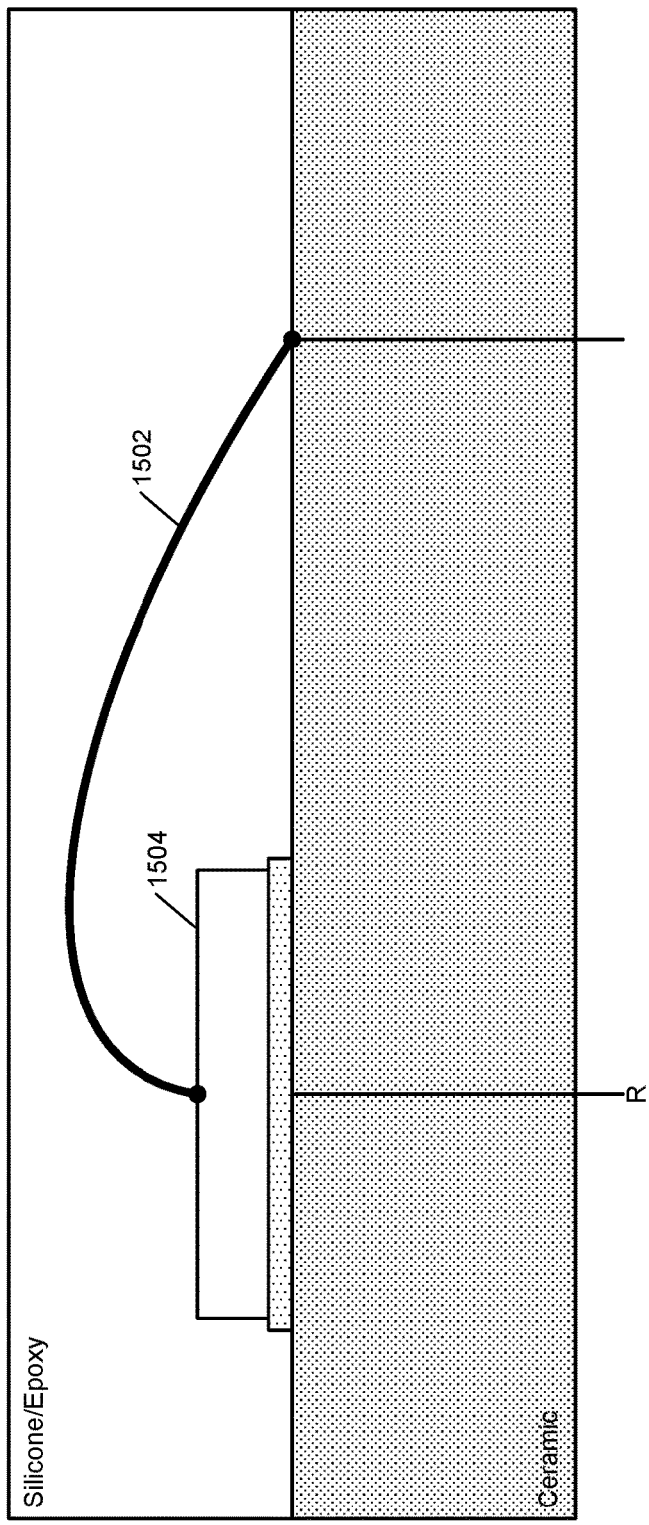

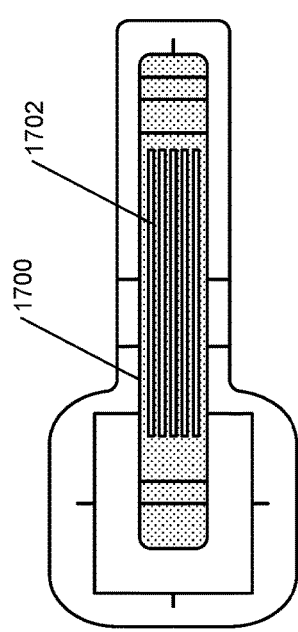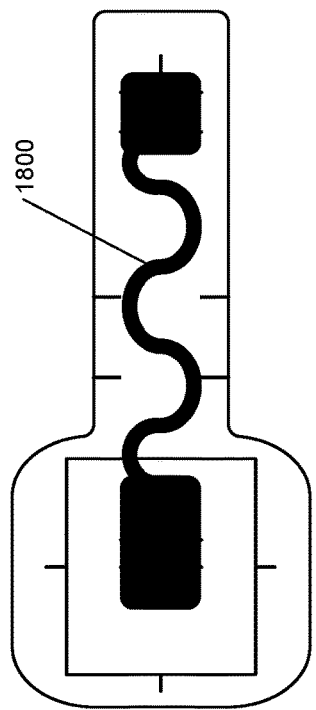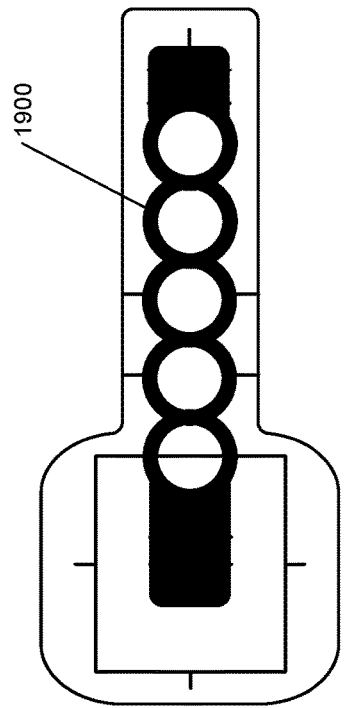

LONG-LIFE EXTENDED TEMPERATURE RANGE EMBEDDED DIODE DESIGN FOR ELECTROSTATIC CHUCK WITH MULTIPLEXED HEATERS ARRAY

CROSS-REFERENCE TO RELATED APPLICATIONS

This application is a U.S. National Phase Application under 35 U.S.C. 371 of International Application No. PCT/US2019/064424, filed on Dec. 4, 2019, which claims the benefit of U.S. Provisional Application No. 62/776,654, filed on Dec. 7, 2018. The entire disclosures of the applications referenced above are incorporated herein by reference.

FIELD

The present disclosure relates generally to plasma processing chambers and more particularly to embedded diode designs for electrostatic chucks with multiplexed heaters array used in plasma processing chambers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Examples of processes that may be performed on a substrate include, but are not limited to, chemical vapor deposition (CVD), plasma enhanced chemical vapor deposition (PECVD), atomic layer deposition (ALD), atomic layer etch (ALE), plasma enhanced atomic layer deposition (PEALD) and/or other etch, deposition, and cleaning processes. During processing, a substrate is arranged on a substrate support, such as a pedestal, an electrostatic chuck (ESC), etc. in a processing chamber of the substrate processing system. A process gas mixture is introduced into the processing chamber to treat the substrate. In some examples, plasma may be struck to enhance chemical reactions within the processing chamber.

SUMMARY

A substrate support for a plasma chamber comprises a base plate arranged along a plane, a first layer of an electrically insulating material arranged on the base plate along the plane, a plurality of heating elements arranged in the first layer along the plane, and a plurality of diodes arranged in respective cavities in the first layer. The plurality of diodes are connected in series to the plurality of heating elements, respectively. Each of the plurality of diodes comprises a die of a semiconductor material arranged in a respective one of the cavities. The semiconductor material has a first coefficient of thermal expansion. The die has a first terminal on a first side of the die and a second terminal on a second side of the die that is opposite to the first side. The first side of the die is arranged on the first layer along the plane. The first terminal of the die is connected to a first electrical contact on the first layer.

For each of the plurality of diodes, the respective one of the cavities further comprises a second layer of an electrically conducting material having a second coefficient of thermal expansion that is greater than the first coefficient of thermal expansion, having a first surface arranged on the second side of the die along the plane, and having a second surface that is opposite to the first surface, the first surface connected to the second terminal of the die. The respective one of the cavities further comprises a conductor having a third coefficient of thermal expansion that is greater than the second coefficient of thermal expansion, having a first end connected to the second surface of the second layer, and having a second end connected to a second electrical contact on the first layer.

In another feature, the substrate support of further comprises a circuit configured to supply power to one of the plurality of heating elements and one of the plurality of diodes connected in series with the one of the plurality of heating elements via the first and second electrical contacts on the first layer.

In another feature, the second layer has a smaller area than the die.

In another feature, the second layer comprises a tungsten-copper alloy or a tungsten-molybdenum alloy.

In another feature, the second layer is coated with a material selected based on a solder material used to bond the second layer to the die and the conductor.

In another feature, the conductor comprises copper.

In another feature, the conductor comprises a tungsten-copper alloy or a tungsten-molybdenum alloy.

In another feature, the die, the second layer, and the conductor are encapsulated in silicone.

In another feature, the die, the second layer, and the conductor are encapsulated in epoxy.

In other features, the electrically insulating material comprises a ceramic material, and the semiconductor material comprises silicon.

In other features, the conductor is flat with a predetermined width and thickness. The conductor includes one or more slits extending along a length of the conductor. The one or more slits terminate at a first distance from the first end of the conductor and at a second distance from the second end from the conductor.

In still other features, a substrate support for a plasma chamber comprises a base plate arranged along a plane, a first layer of an electrically insulating material arranged on the base plate along the plane, a plurality of heating elements arranged in the first layer along the plane, and a plurality of diodes arranged in respective cavities in the first layer. The plurality of diodes are connected in series to the plurality of heating elements, respectively. Each of the plurality of diodes comprises a die of a semiconductor material arranged in a respective one of the cavities. The semiconductor material has a first coefficient of thermal expansion. The die has a first terminal on a first side of the die and a second terminal on a second side of the die that is opposite to the first side. The first side of the die arranged on the first layer along the plane. The first terminal of the die connected to a first electrical contact on the first layer.

For each of the plurality of diodes, the respective one of the cavities further comprises a conductor having a second coefficient of thermal expansion that is greater than the first coefficient of thermal expansion, having a first end connected to the second terminal of the die, having a second end connected to a second electrical contact on the first layer, and having a first portion adjacent to the first end that deflects away from the second side of the die at an acute angle relative to the plane.

In another feature, the substrate support further comprises a circuit configured to supply power to one of the plurality of heating elements and one of the plurality of diodes connected in series with the one of the plurality of heating elements via the first and second electrical contacts on the first layer.

In another feature, the substrate support further comprises a support having a first surface arranged on the first layer of the electrically insulating material along the plane and a second surface on which a second portion of the conductor is arranged, with the second portion being between the first portion and the second end of the conductor.

In another feature, the conductor comprises copper.

In another feature, the conductor comprises a tungsten-copper alloy or a tungsten-molybdenum alloy.

In another feature, the die and the conductor are encapsulated in silicone.

In another feature, the die and the conductor are encapsulated in epoxy.

In other features, the electrically insulating material comprises a ceramic material, and the semiconductor material comprises silicon.

In other features, the conductor is flat with a predetermined width and thickness. The conductor includes one or more slits extending along a length of the conductor. The one or more slits terminate at a first distance from the first end of the conductor and at a second distance from the second end from the conductor.

In other features, a portion of the conductor has a serpentine shape or a wavy shape. The portion terminates at a first distance from the first end of the conductor and at a second distance from the second end from the conductor.

In still other features, a substrate support for a plasma chamber comprises a base plate arranged along a plane, a first layer of an electrically insulating material arranged on the base plate along the plane, a plurality of heating elements arranged in the first layer along the plane, and a plurality of diodes arranged in respective cavities in the first layer. The plurality of diodes are connected in series to the plurality of heating elements, respectively.

Each of the plurality of diodes comprises a die of a semiconductor material arranged in a respective one of the cavities. The semiconductor material has a first coefficient of thermal expansion. The die has a first terminal on a first side of the die and a second terminal on a second side of the die that is opposite to the first side. The first side of the die arranged on the first layer along the plane. The first terminal of the die connected to a first electrical contact on the first layer. For each of the plurality of diodes, the respective one of the cavities further comprises a bond wire having a first end connected to the second terminal of the die and a second end connected to a second electrical contact on the first layer.

In another feature, the die and the bond wire are encapsulated in silicone or epoxy.

In other features, the electrically insulating material comprises a ceramic material, and the semiconductor material comprises silicon.

In another feature, the substrate support further comprises a circuit configured to supply power to one of the plurality of heating elements and one of the plurality of diodes connected in series with the one of the plurality of heating elements via the first and second electrical contacts on the first layer.

In still other features, an apparatus comprises a first layer of an electrically insulating material arranged along a plane. The first layer has a first electrical contact and a second electrical contact located at a distance from the first electrical contact along the plane. The apparatus further comprises a die comprising a semiconductor material having a first coefficient of thermal expansion and having a first terminal on a first side of the die and a second terminal on a second side of the die that is opposite to the first side. The first side of the die is arranged on the first layer along the plane. The first terminal of the die is connected to the first electrical contact on the first layer. The apparatus further comprises a second layer of an electrically conducting material having a second coefficient of thermal expansion that is greater than the first coefficient of thermal expansion, having a first surface arranged on the second side of the die along the plane, and having a second surface that is opposite to the first surface, the first surface connected to the second terminal of the die. The apparatus further comprises a conductor having a third coefficient of thermal expansion that is greater than the second coefficient of thermal expansion, having a first end connected to the second surface of the second layer, and having a second end connected to the second electrical contact on the first layer.

In another feature, the second layer has a smaller area than the die.

In another feature, the second layer comprises a tungsten-copper alloy or a tungsten-molybdenum alloy.

In another feature, the second layer is coated with a material selected based on a solder material used to bond the second layer to the die and the conductor.

In another feature, the conductor comprises copper.

In another feature, the conductor comprises a tungsten-copper alloy or a tungsten-molybdenum alloy.

In another feature, the die, the second layer, and the conductor are encapsulated in silicone.

In another feature, the die, the second layer, and the conductor are encapsulated in epoxy.

In other features, the electrically insulating material comprises a ceramic material, and the semiconductor material comprises silicon.

In other features, the conductor is flat with a predetermined width and thickness. The conductor includes one or more slits extending along a length of the conductor. The one or more slits terminate at a first distance from the first end of the conductor and at a second distance from the second end from the conductor.

In still other features, an apparatus comprises a layer of an electrically insulating material arranged along a plane. The layer has a first electrical contact and a second electrical contact located at a distance from the first electrical contact along the plane. The apparatus further comprises a die comprising a semiconductor material having a first coefficient of thermal expansion and having a first terminal on a first side of the die and a second terminal on a second side of the die that is opposite to the first side. The first side of the die is arranged on the layer along the plane. The first terminal of the die is connected to the first electrical contact on the layer. The apparatus further comprises a conductor having a second coefficient of thermal expansion that is greater than the first coefficient of thermal expansion, having a first end connected to the second terminal of the die, having a second end connected to the second electrical contact on the layer, and having a first portion adjacent to the first end that deflects away from the second side of the die at an acute angle relative to the plane.

In another feature, the apparatus further comprises a support having a first surface arranged on the layer of the electrically insulating material along the plane and a second surface on which a second portion of the conductor is arranged, with the second portion being between the first portion and the second end of the conductor.

In another feature, the conductor comprises copper.

In another feature, the conductor comprises a tungsten-copper alloy or a tungsten-molybdenum alloy.

In another feature, the die and the conductor are encapsulated in silicone.

In another feature, the die and the conductor are encapsulated in epoxy.

In other features, the electrically insulating material comprises a ceramic material, and the semiconductor material comprises silicon.

In other features, the conductor is flat with a predetermined width and thickness. The conductor includes one or more slits extending along a length of the conductor. The one or more slits terminating at a first distance from the first end of the conductor and at a second distance from the second end from the conductor.

In other features, a portion of the conductor has a serpentine shape or a wavy shape. The portion terminates at a first distance from the first end of the conductor and at a second distance from the second end from the conductor.

In still other features, an apparatus comprises a layer of an electrically insulating material arranged along a plane. The layer has a first electrical contact and a second electrical contact located at a distance from the first electrical contact along the plane. The apparatus further comprises a die comprising a semiconductor material and having a first terminal on a first side of the die and a second terminal on a second side of the die that is opposite to the first side. The first side of the die is arranged on the layer along the plane. The first terminal of the die is connected to the first electrical contact on the layer. The apparatus further comprises a bond wire having a first end connected to the second terminal of the die and a second end connected to the second electrical contact on the layer.

In another feature, the die and the bond wire are encapsulated in silicone or epoxy.

In other features, the electrically insulating material comprises a ceramic material, and the semiconductor material comprises silicon.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 13 shows a table comprising a summary of the diode designs shown in FIGS. 3-9;

FIGS. 15 and 16 show a sixth diode design according to the present disclosure that uses wire bonding instead of metal strap connectors used in the diode designs shown in FIGS. 7-14; and FIGS. 17-21 show additional examples of optimal shapes for the metal strap connectors shown in the diode designs shown in FIGS. 7-14.

In the drawings, reference numbers may be reused to identify similar and/or identical elements.

DETAILED DESCRIPTION

As explained below in detail, multiple heater elements can be arranged in an electrostatic chuck (ESC) of a plasma chamber to control temperature profiles of substrates such as semiconductor wafers during processing in the plasma chamber. Diodes can be connected in series with the heater elements to enable independent control of the heater elements. The heater elements and the diodes can be embedded in the ESC. In some processes, the diodes can be subjected to relatively high temperatures that can cause the diodes to fail, which can destroy the ability to individually control the heater elements. The present disclosure relates to various novel designs for embedding diodes in the ESC that can withstand relatively high temperatures.

Figure 12:
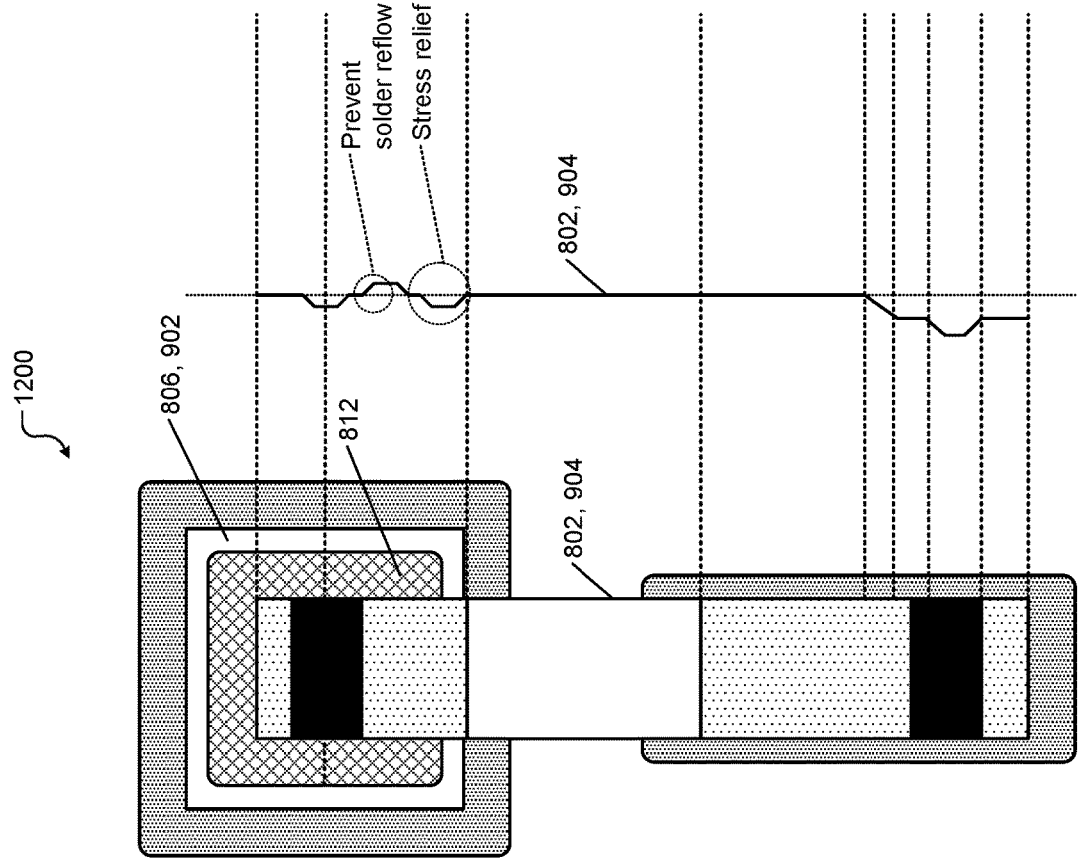
FIG. 12 shows a top view of the second and third diode designs shown in FIGS. 8 and 9.

The present disclosure is organized as follows. An example of a processing chamber is shown and described with reference to FIG. 1. An ESC with embedded heater elements and diodes is shown and described with reference to FIGS. 2 and 3. A schematic of an array comprising heater elements and diodes used in the ESC is shown and described with reference to FIG. 4. An example of a diodes embedded in the ESC is shown and described with reference to FIG. 5. Failures of the diodes that can occur at relatively high temperatures are discussed with reference to FIG. 6. Various novel designs for embedding diodes in the ESC are shown and described with reference to FIGS. 7-10. Additional views of the novel designs are shown in FIGS. 11 and 12. The novel designs are summarized in a table shown in FIG. 13. Additional novel design features for embedding diodes in the ESC are shown and described with reference to FIGS. 14-21.

Figure 1:
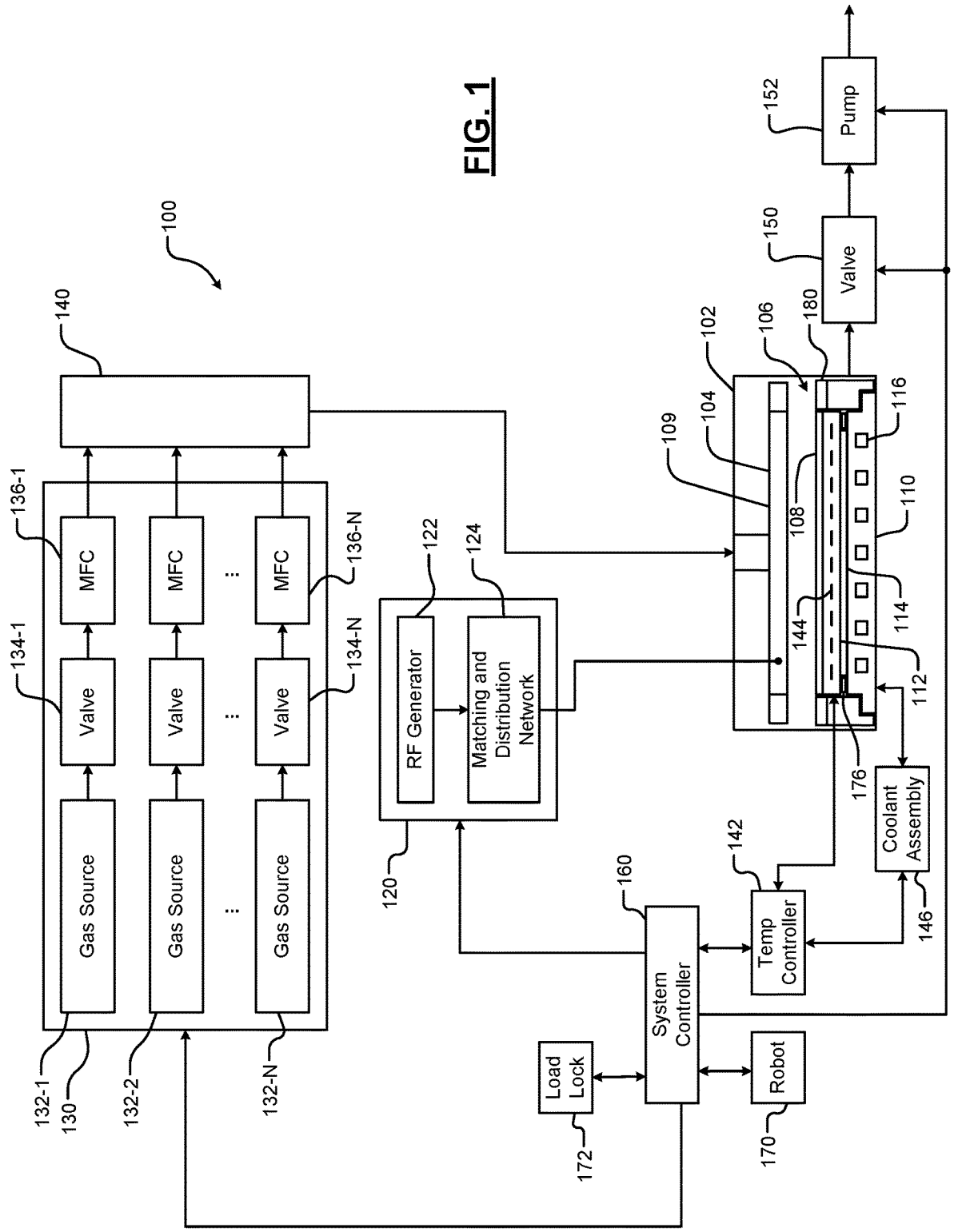
FIG. 1 shows an example of a substrate processing system.

FIG. 1 shows an example of a substrate processing system 100. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Current is provided to the TCEs 144 to control the temperature of the substrate support 106 via connection terminals (not shown in FIG. 1) according to the principles of the present disclosure as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 may correspond to a top ring, which may be supported by a bottom ring 184. In some examples, the edge ring 180 may be further supported by one or more of a middle ring (not shown in FIG. 1), a stepped portion of the ceramic layer 112, etc. as described below in more detail. The edge ring 180 according to the principles of the present disclosure is moveable (e.g., moveable upward and downward in a vertical direction) relative to the substrate 108. For example, the edge ring 180 may be controlled via an actuator responsive to the system controller 160. In some examples, the edge ring 180 may be adjusted during substrate processing (i.e., the edge ring 180 may be a tunable edge ring). In other examples, the edge ring 180 may be removable (e.g., using the robot 170, via an airlock, while the processing chamber 102 is under vacuum). In still other examples, the edge ring 180 may be both tunable and removable.

Figure 2:
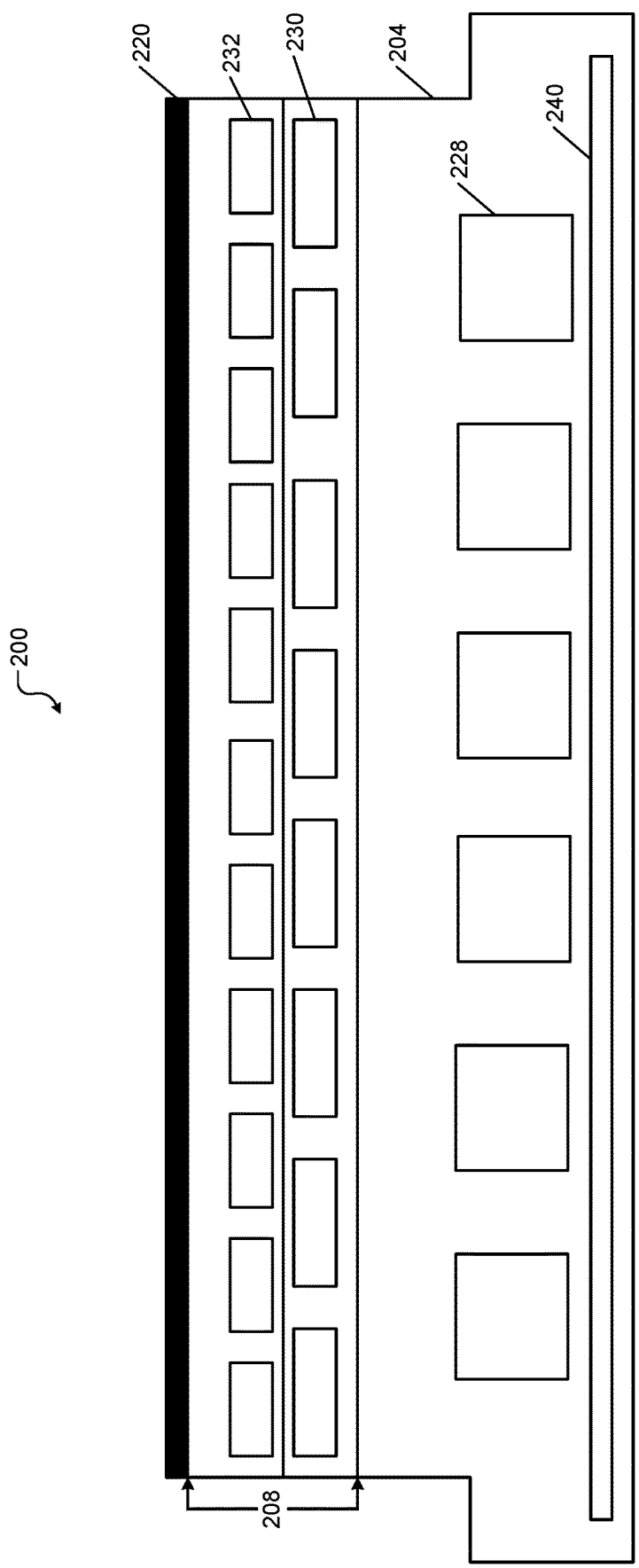
FIG. 2 shows a simplified example of a substrate support such as an electrostatic chuck (ESC) used to support substrates during processing in the plasma chamber of FIG. 1.

FIG. 2 shows a simplified example of a substrate support 200. The substrate support 200 includes a baseplate 204 configured to support a ceramic layer 208. The ceramic layer 208 is configured to support a substrate 220 during processing. The baseplate 204 may include one or more coolant channels 228 for flowing coolant through the baseplate 204.

The ceramic layer 208 includes multiple zone heaters (also called macro heaters) 230 for bulk radial tuning and a grid of die-by-die heaters (also called micro heaters) 232 for non-radial tuning of temperature of the ceramic layer 208 during the processing of the substrate 220. The zone heaters 230 are independently controllable to coarsely control temperatures of respective zones of the ceramic layer 208. The die-by-die heaters 232 are distributed across multiple zones of the ceramic layer 208 and can be individually controlled to finely control temperatures in specific locations within the ceramic layer 208 to compensate for temperature non-uniformities, etc.

The die-by-die heaters 232 are independently controllable to provide localized, dynamic temperature tuning as explained below with reference to FIGS. 3 and 4. The heaters 230 and 232 are collectively called heater elements throughout the present disclosure. These heater elements provide the ability to fine-tune critical dimension (CD) non-uniformities based on metrology feedback. A circuit board (e.g., a distribution board) 240 is embedded in or adjacent to a bottom surface of the baseplate 204 to supply power (e.g., AC power, pulse width modulated DC power, etc.) to these heating elements.

Figure 3:
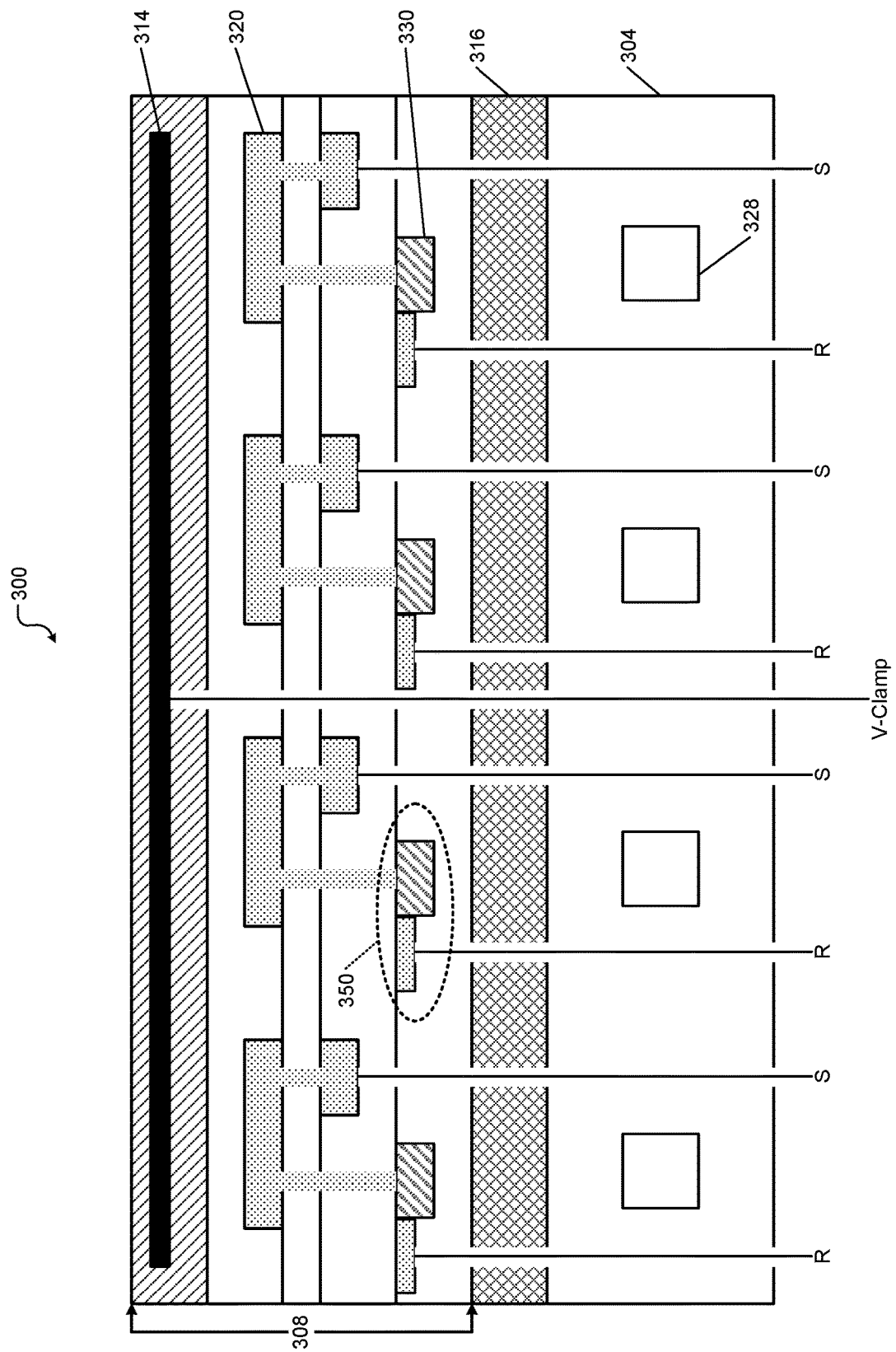
FIG. 3 shows the substrate support of FIG. 2 in further detail.

FIG. 3 shows a simplified example of a substrate support 300, which is similar to the substrate support 200 shown in FIG. 2, in further detail. The substrate support 300 includes a baseplate 304 configured to support a ceramic layer 308. The ceramic layer 308 is configured to support a substrate (e.g., the substrate 220 shown in FIG. 2) during processing. The ceramic layer 308 includes a clamping electrode 314 to electrostatically clamp the substrate during processing when a voltage (e.g., V-Clamp) is applied to the clamping electrode 314. A thermal barrier layer 316 (e.g., a bond layer comprising a suitable bonding material) bonds the ceramic layer 308 to the baseplate 304. The baseplate 304 may include one or more coolant channels 328 for flowing coolant through the baseplate 304.

In the example shown, the ceramic layer 308 comprises a plurality of layers. In some implementations, all of the plurality of layers may comprise a ceramic material. In some implementations, the layer comprising the clamping electrode 314 may comprise a ceramic material, and the other layers may comprise other suitable electrically insulating material. Many other configurations and material compositions for the ceramic layer 308 are contemplated.

Figure 5:
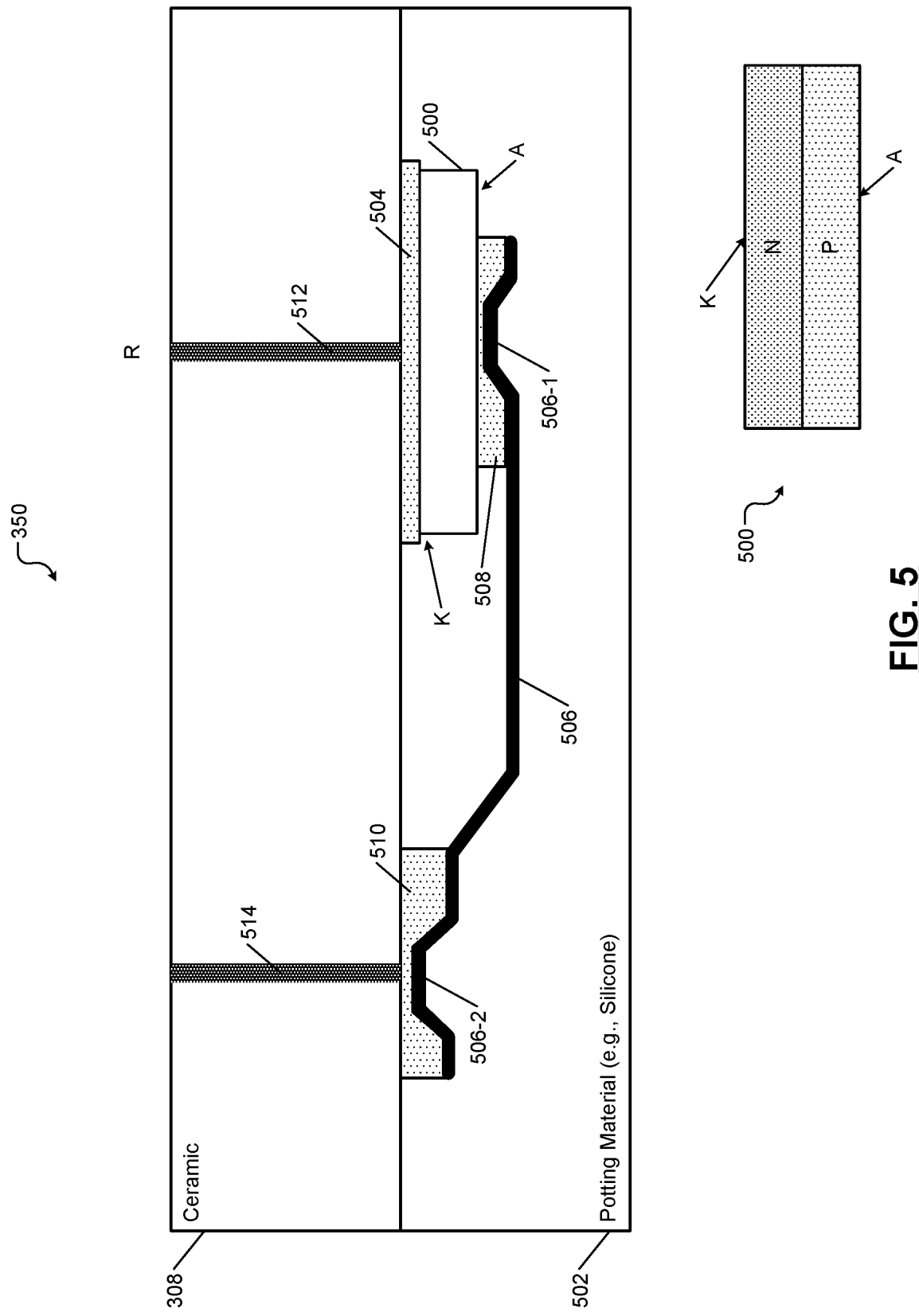
FIG. 5 shows an expanded view of a portion of FIG. 3, showing one of the diodes in further detail.

A plurality of heater elements 320 are arranged in the ceramic layer 308. A diode 330 is connected in series with each heater element 320. A plurality of diodes 330 is embedded near the bottom of the ceramic layer 308 (i.e., closer to the thermal barrier layer 316). An expanded view of a dotted oval area 350 is shown in FIG. 5 to illustrate the diode 330 in further detail. A circuit board (e.g., a distribution board, similar to element 240 shown in FIG. 2) is embedded within or adjacent to a bottom surface of the baseplate 304 to supply power (e.g., AC power, pulse width modulated DC power, etc.) to the heating elements 320 via power supply and power return lines, denoted respectively as S and R throughout the figures.

Each heater element 320 is connected to one power supply line and one power return line connected to the circuit board. No two heater elements 320 share the same pair of power supply and power return lines. By providing suitable electrical switching arrangements in the circuit board, it is possible to connect a pair of power supply line and power return line to a power supply such that only one heater element 320 connected to this pair of power lines is powered. A time-averaged heating power of each heater element 320 can be individually tuned by employing time-domain multiplexing in the circuit board.

Figure 4:
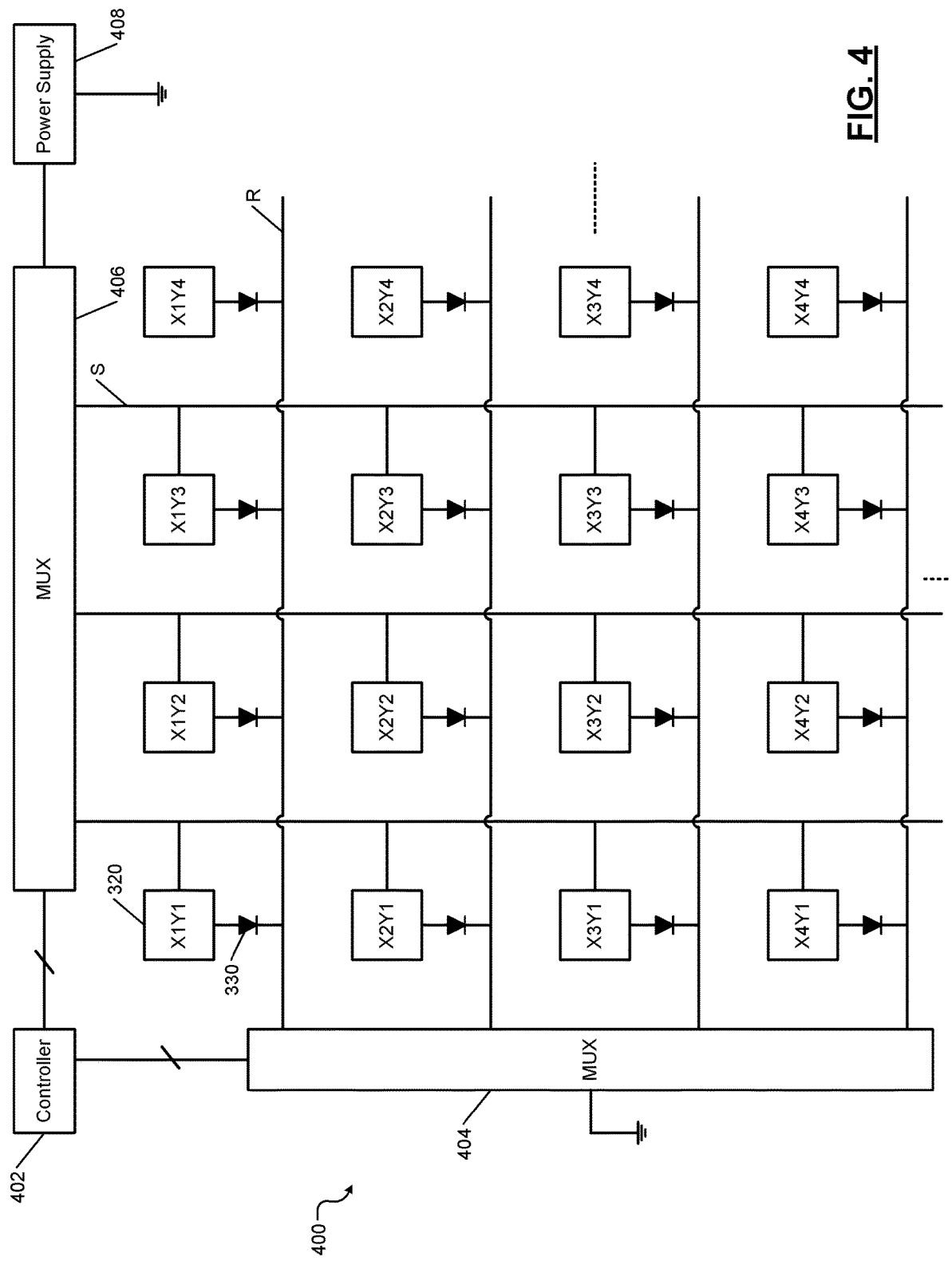
FIG. 4 shows a schematic representation of a heater matrix comprising heater elements and diodes used in the substrate support of FIG. 3.

FIG. 4 shows a schematic representation of a heater matrix 400 comprising the heater elements 320 and the diodes 330. Connecting the diode 330 in series with the heater element 320 enables passive heater matrix addressing, which allows independent control of the heater elements 320 to provide fine local temperature control of the ceramic layer 308. The plurality of diodes 330 on the return side of the heater elements 320 between the heater element and the return line blocks the reverse flow of current through all the other heater elements ensuring that only the active heater element is powered. A controller 402 (e.g., the circuit board 240 shown in FIG. 2) controls multiplexers 404 and 406 to select one of the heater elements 320 so that power from a power supply 408 is supplied to the selected heater element 320.

Diodes embedded in ESC ceramic (e.g., the ceramic layer 308) allows realizing independent control of ESC heater array (e.g., the heater elements 320) because the diodes enable passive heater matrix addressing. Diodes are positioned on the return side of the heater elements between the heater element and the return line to block the reverse flow of current through all the other heater elements ensuring that only the active heater element is powered. Inside ESC ceramic, diodes are embedded into ceramic cavities filled with potting material near bottom of ESC ceramic. A diode is typically in form of a bare silicon die, with cathode and anode on each side of die. Cathode of the die (bottom surface) is bonded to a metalized contact on the ceramic layer directly by soldering. Anode of the die (upper surface) is bonded to a metal connector by solder. The metal connector bridges between the die and an interconnect contact pad. Both cathode and anode are bonded to via contacts in the same layer as return line.

FIG. 5 shows the expanded view of the dotted oval area 350 shown in FIG. 3, which shows the diode 330 in further detail. The diode 330 comprises a bare silicon die 500. The die 500 comprises a P and N type doped silicon. The die 500 is arranged in a cavity in the ceramic layer 308 (shown in FIG. 3) filled with a potting material 502 within the ceramic layer 308 (shown in FIG. 3). The potting material 502 generally comprises silicone. The cathode (K) and anode (A) of the diode 330 are bonded onto the ceramic layer 308 via contacts in the same layer as return lines.

The cathode K is bonded directly to a metalized contact on the ceramic layer 308 by solder material 504. The anode A is bonded by solder material 508 to a metal (e.g., copper) strap connector 506 that bridges between the die and an interconnect contact pad. Specifically, the anode A is bonded to a first end 506-1 of the metal strap connector 506 by solder material 508. A second end 506-2 of the metal strap connector 506 is bonded to an interconnect contact pad on the ceramic layer 308 by solder material 510. A via 512 connects the cathode K to a power return line R via the solder material 504. A via 514 connects the anode A to a first end of a heating element (e.g., the heating element 320 shown in FIG. 4) via the metal strap connector 506 and the solder material 510 and 508. A second end of the heating element is connected to a power supply line S (as shown in FIG. 4).

Figure 6:
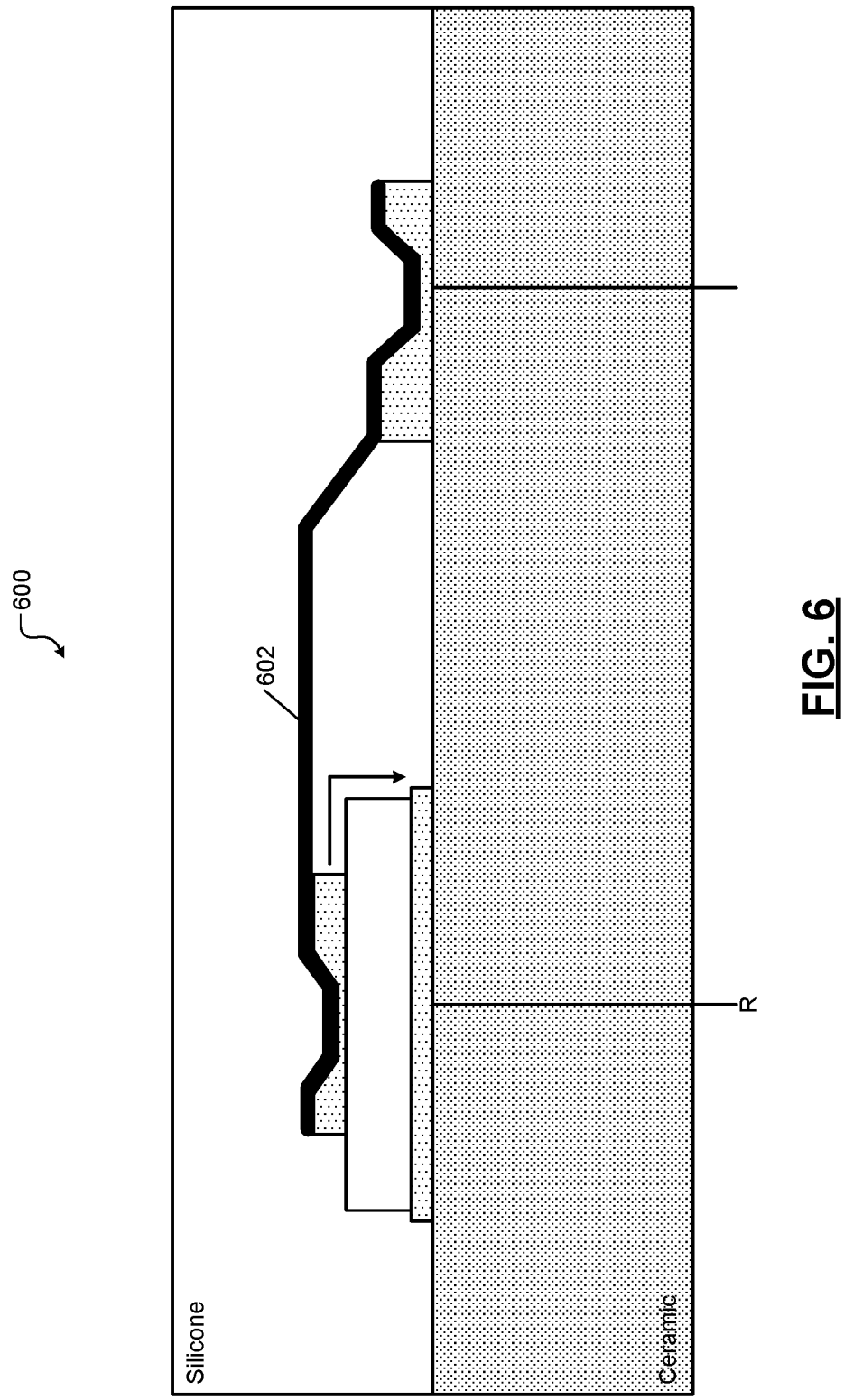
FIG. 6 shows a view of FIG. 5 rotated (inverted) by 180 degrees around a vertical axis.

FIG. 6 shows a view 600 of FIG. 5 rotated by 180 degrees around a vertical axis. This orientation is presented to facilitate the discussions of the designs shown and described with reference to subsequent figures. Since FIG. 6 is identical to FIG. 5 in all respects, a description of FIG. 6 is unnecessary and is omitted for brevity.

The diode design shown in FIGS. 3-6 works reliably for a process recipe temperature range of 0 to 60~70 C and for a chuck (or ceramic) temperature range Tmax, min=−20 C, 120 C. However, some emerging critical etch processes (e.g., boron doped carbon etch) require extended high chuck (ceramic) temperature up to ~175 C or more, as well as relatively extreme and large process recipe temperature range (~140 C). Diodes with the design shown in FIGS. 3-6 cannot survive at these extended operating temperature conditions, which exert excessive thermal stress and fatigue on the diodes due to excessive chuck (ceramic) temperature and due to cycling temperature variations during different processes. Consequently, the diodes tend to fail prematurely, which results in permanent and total ESC failure. Without advanced thermal stress control engineering that can improve the embedded diode design, it is not possible to mass-produce ESC's that can operate reliably during these emerging etch processes.

Specifically, using the metal (e.g., copper) strap connector, reflow soldering, and silicone based encapsulation polymer to form the embedded diode package (shown in FIGS. 3-6) works well for a process recipe temperature range from 0 to 60~70 C and a chuck (ceramic) temperature range Tmax, min=−20 C, 120 C. However, this design poses problems for ESC lifetime and tool capability when significantly expanding the process operating temperature range to more than 140 C range and when significantly expanding the chuck (ceramic) temperature range Tmax, min=−60 C, 175+ C. In these expanded temperature ranges, the above design causes premature diode short failures. Stated generally, the above diode design works well up to a certain threshold process recipe temperature range and up to a certain threshold chuck (ceramic) temperature range. The above diode design fails beyond these thresholds.

The failure is caused by cracking of the silicon diode die near the electrical connection on the diode's anode side. The cracking occurs largely due to materials having different coefficient of thermal expansion (CTE's) at the diode's bare die anode interface (e.g., CTE of silicon is 3.4 ppm/deg C., and CTE of copper is 17.2 ppm/deg C.). The CTE mismatch between the silicon diode bare die and the copper strap connector causes excessive strain/stress on the diode's top side electrode (i.e., anode).

As FIG. 6 shows, at relatively high temperatures (e.g., temperatures greater than the above thresholds), the anode and the straight portion 602 of the copper strap connector near the anode form a capillary through which the reflow solder reaches the edge of the diode as shown by the downward arrow. Further, silicon is a brittle material and cannot withstand excessive strain/stress under large cyclic temperature conditions required by the various emerging process recipes (e.g., Boron doped carbon etch).

The diodes fail prematurely. The diode failure causes permanent ESC failure. Premature failure requires replacement under warranty since the ESC cannot be repaired or refurnished after diode failure. The diode failure causes ESC thermal runaway and potential massive production wafer scrap due to lack of a robust failure detection mechanism. Consequently, a tool with the above diode design cannot be used for emerging etch applications (e.g., Boron doped carbon etch).

The present disclosure provides various diode designs that reduce local thermal stress around the bare die of the silicon diodes. These diode designs significantly increase the lifetime and the operating temperature range relative to the above diode design as explained below in detail. These diode designs result in not only significantly extended operating temperature window without compromising ESC reliability but also minimal cost and manufacturing process impact.

Figure 7:
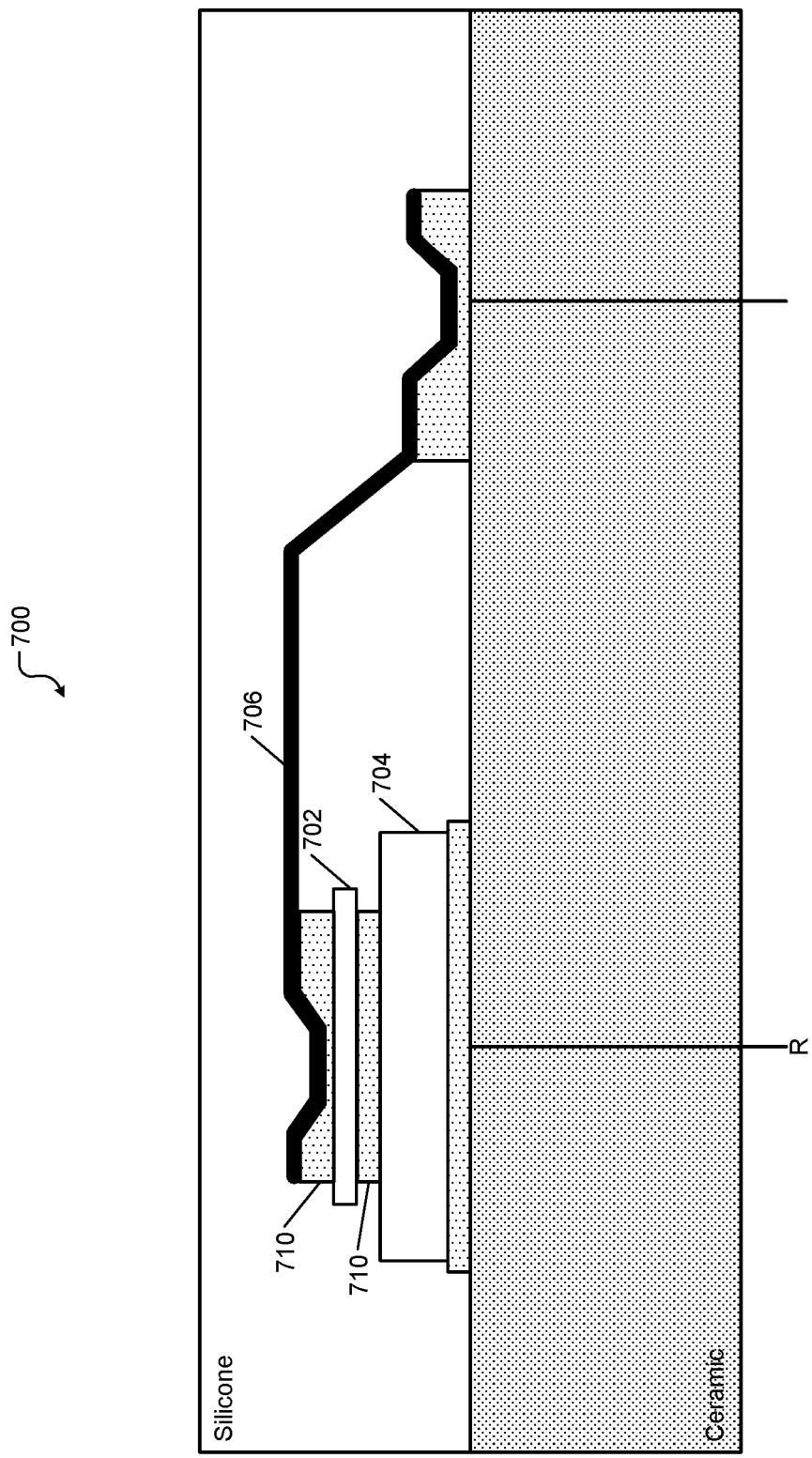
FIG. 7 shows a first diode design according to the present disclosure.

FIG. 7 shows a first diode design 700 according to the present disclosure. In the design 700, a thin plate 702 is inserted between the silicon die 704 and the metal strap connector 706. The thin plate 702 comprises a material having an intermediate CTE between the CTE of the silicon used in the silicon die 704 and the CTE of the metal (e.g., copper) used for the metal strap connector 706.

The thin plate 702 reduces the CTE mismatch between the silicon die 704 and the metal strap connector 706. The thin plate 702 can comprise a material having relatively high electrical and thermal conductivities. For example, the thin plate 702 can comprise a W—Cu plate (CTE 7.2 ppm/deg C.), a W—Mo plate, or a plate of a similar material (i.e., having CTE between the CTE's of silicon and copper). The thickness of the thin plate 702 can be such that the thin plate 702 can provide support for the metal strap connector 706 but does not present a relatively high electrical resistance. The area of the thin plate 702 can be smaller than a metallization area of the silicon die 704.

Further, the thin plate 702 can comprise (i.e., can be coated with) a plating of a material that is suitable for bonding to the solder material 710 used to bond the thin plate 702 to the silicon die 704 and the metal strap connector 706. For example, the thin plate 702 can comprise (i.e., can be coated with) Ni plating.

The metal strap connector 706 is designed to match the height of a stack comprising the silicon die 704 and the thin plate 702. This structure also avoids formation of a high thermal stress point at high temperatures by preventing the solder material 710 from reaching the edge of the silicon die 704, which prevents the failure of the diode. This structure is encapsulated in silicone similar to the diode design shown in FIGS. 3-6. That is, the potting material or resin used in the design 700 is silicone.

From the manufacturing standpoint, the thin plate 702 and the silicon die 704 can be pre-assembled and soldered using the same automatic manufacture equipment, which reduces manufacturing variability and cost by eliminating manual operation and by using a simplified manufacturing process.

Figure 8:
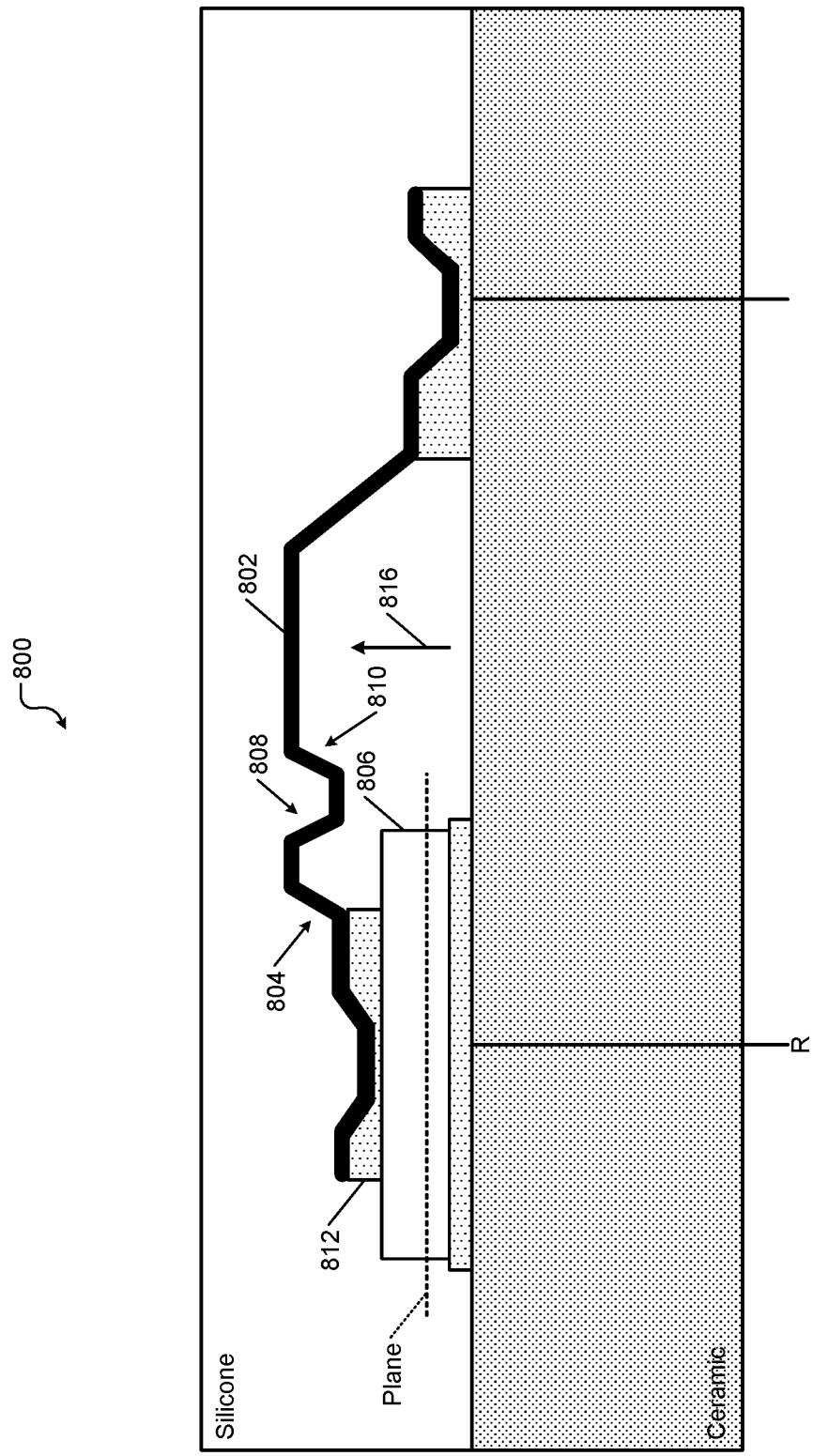
FIG. 8 shows a second diode design according to the present disclosure.

FIG. 8 shows a second diode design 800 according to the present disclosure. In the design 800, the thin plate 702 shown in FIG. 7 is not used. Instead, the design 800 differs from the design shown in FIGS. 3-6 in that the design of the metal strap connector is different. Specifically, the design 800 uses a thin metal strap connector 802 with reduced thickness relative to the metal strap connector used in the design shown in FIGS. 3-6. Additionally, the metal strap connector 802 has an optimized shape obtained by bending the metal strap connector 802 as shown and as described below. The size and shape of the metal strap connector 802 provide additional flexibility to reduce thermal stress on the diode.

Specifically, the metal strap connector 802 is bent and is thinner relative to the metal strap connector used in the design shown in FIGS. 3-6. More specifically, the metal strap connector 802 is bent such that the metal strap connector 802 deflects away from the plane of the silicon die 806 at an acute angle as shown at 804. Thereafter, the metal strap connector 802 is bent again towards the plane of the silicon die 806 at an acute angle as shown at 808 and is then bent again away from the plane of the silicon die 806 at an acute angle as shown at 810. The bent shape of the metal strap connector 802 increases the flexibility of the metal strap connector 802 and improves the ability of the metal strap connector 802 to handle stress in a direction vertical to the plane of the silicon die 806 as shown by the arrow 816.

Further, in the design 800, since the metal strap connector 802 is bent such that the metal strap connector 802 deflects away from the plane of the silicon die 806 at an acute angle as shown at 804, there is no capillary formation between the silicon die 806 and the metal strap connector 802 at the anode. Consequently, the solder material 812 that connects the metal strap connector 802 to the silicon die 806 does not reach the edge of the silicon die 806 at high temperatures.

Accordingly, the bent design of the metal strap connector 802 prevents the formation of a high thermal stress point at high temperatures by preventing the solder material 812 from reaching the edge of the silicon die 806. This prevents the failure of the diode at high temperatures. This structure is encapsulated in silicone similar to the design shown in FIGS. 3-6. That is, the potting material or resin used in the design 800 is silicone.

Various other configurations and shapes for the metal strap connector are contemplated. Some examples of the configurations and shapes for the metal strap connector are shown and described below with reference to FIGS. 16-21.

Figure 9:
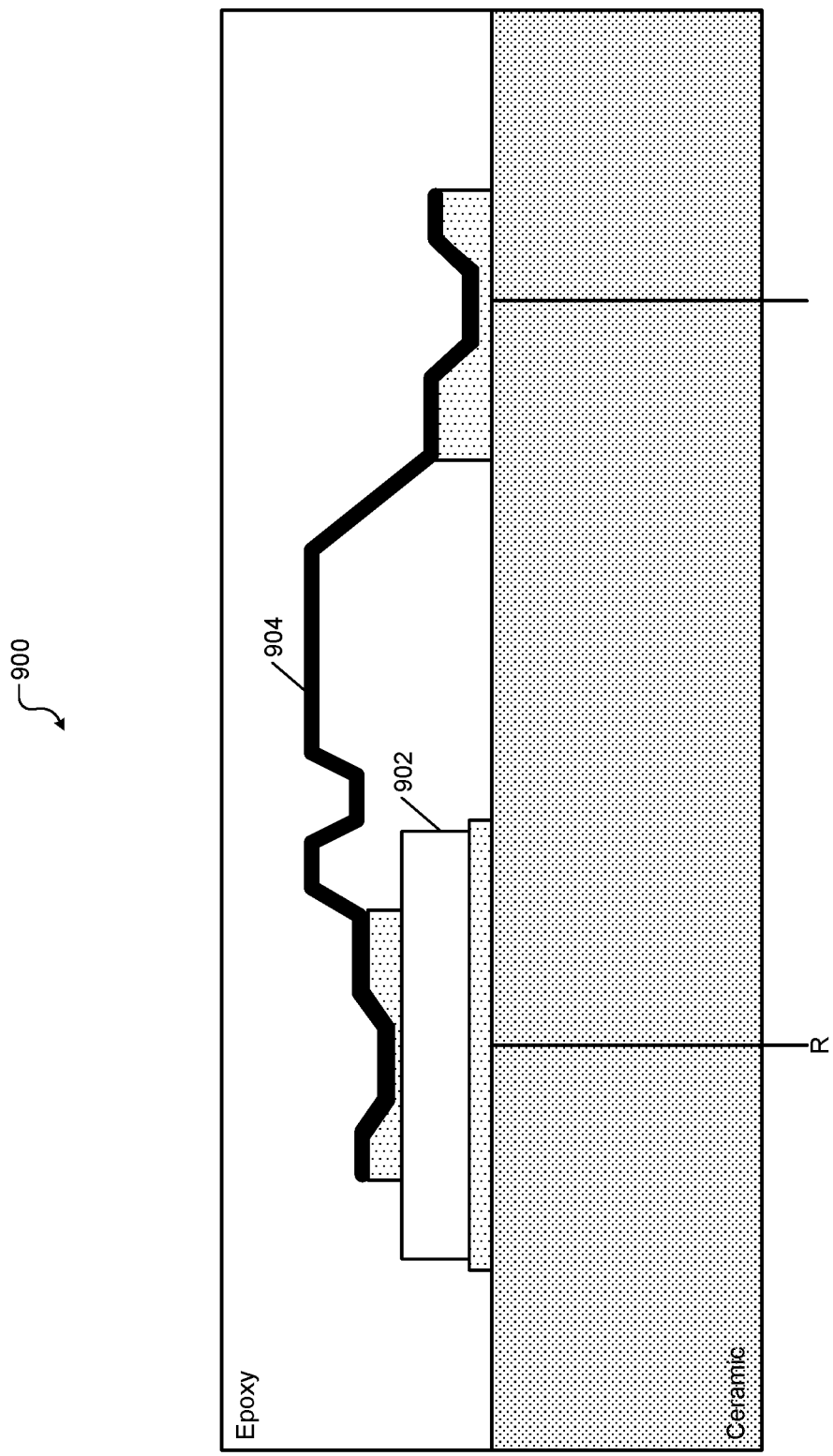
FIG. 9 shows a third diode design according to the present disclosure.

FIG. 9 shows a third diode design 900 according to the present disclosure. The design 900 is similar to the design 800 shown in FIG. 8 except that the structure in the design 900 is encapsulated in epoxy instead of silicone shown in FIGS. 3-6. That is, the potting material or resin used in the design 900 is epoxy instead of silicone. The epoxy based potting material has a relatively low CTE and reduces the CTE mismatch between the silicon die 902 and the metal (e.g., copper) used to form the metal strap connector 904, which prevents the failure of the diode.

Figure 10:
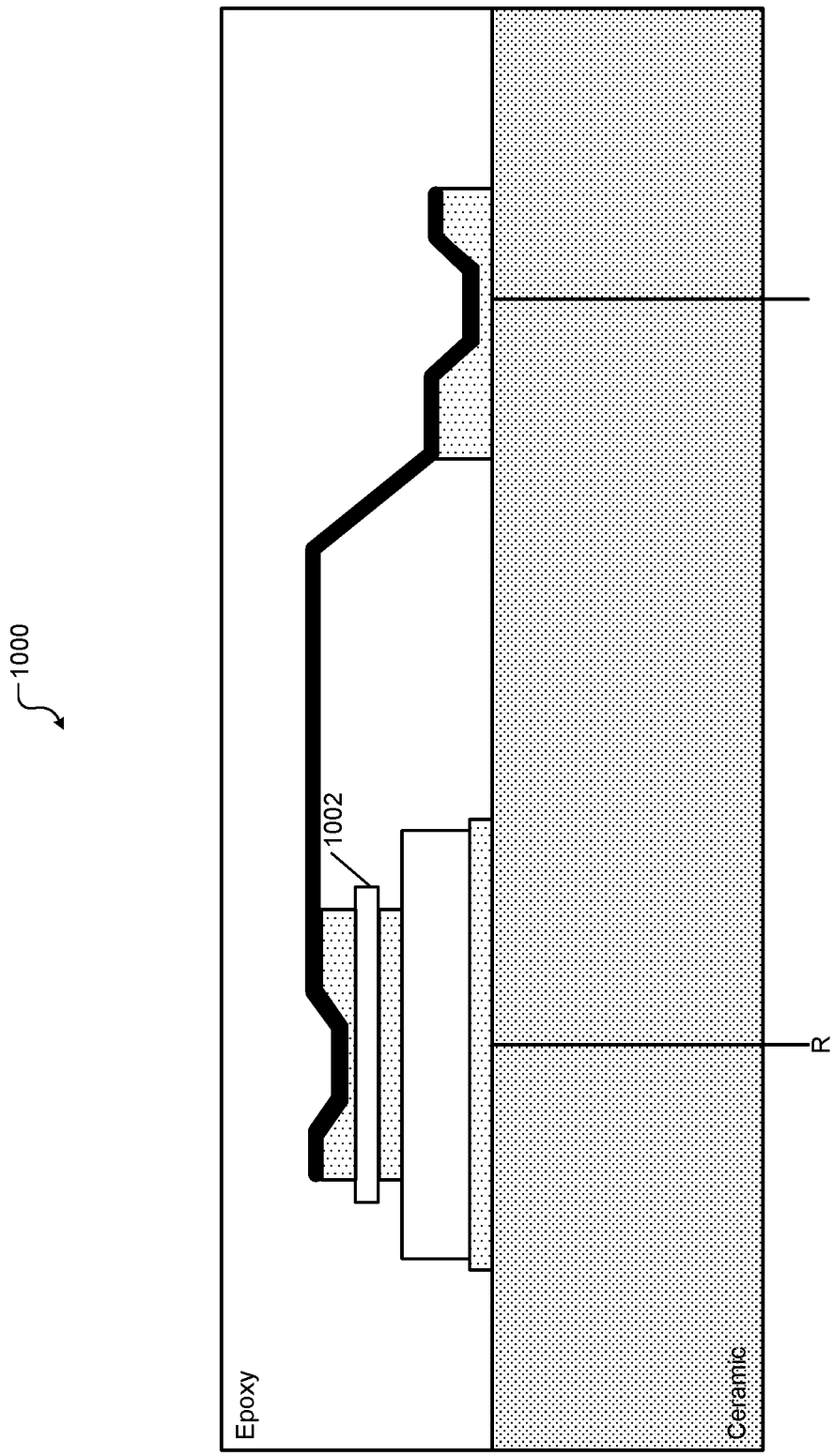
FIG. 10 shows a fourth diode design according to the present disclosure.
Figure 11:
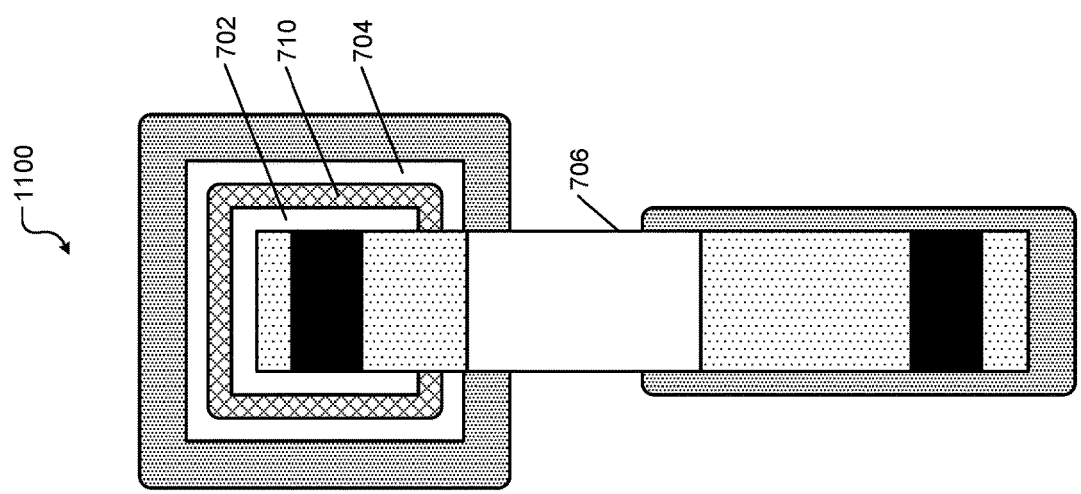
FIG. 11 shows a top view of the first diode design of FIG. 7.

FIG. 10 shows a fourth diode design 1000 according to the present disclosure. The design 1000 combines the features the designs shown in FIGS. 7-9. Specifically, the design 1000 employs the thin plate 1002 similar to the thin plate 702 shown and described with reference to FIG. 7. Additionally, the design 1000 employs the epoxy based potting material shown and described with reference to FIG. 9. Further, while not shown, the design 1000 can additionally employ a bent metal strap connector similar to the metal strap connectors shown and described with reference to FIGS. 8 and 9.

FIG. 11 shows a top view 1100 of the design 700 shown in FIG. 7. FIG. 12 shows a top view 1200 of the designs 800 and 900 shown in FIGS. 8 and 9. FIG. 13 shows a table 1300 comprising a summary of the features of the designs shown in FIGS. 3-9.

Figure 14:
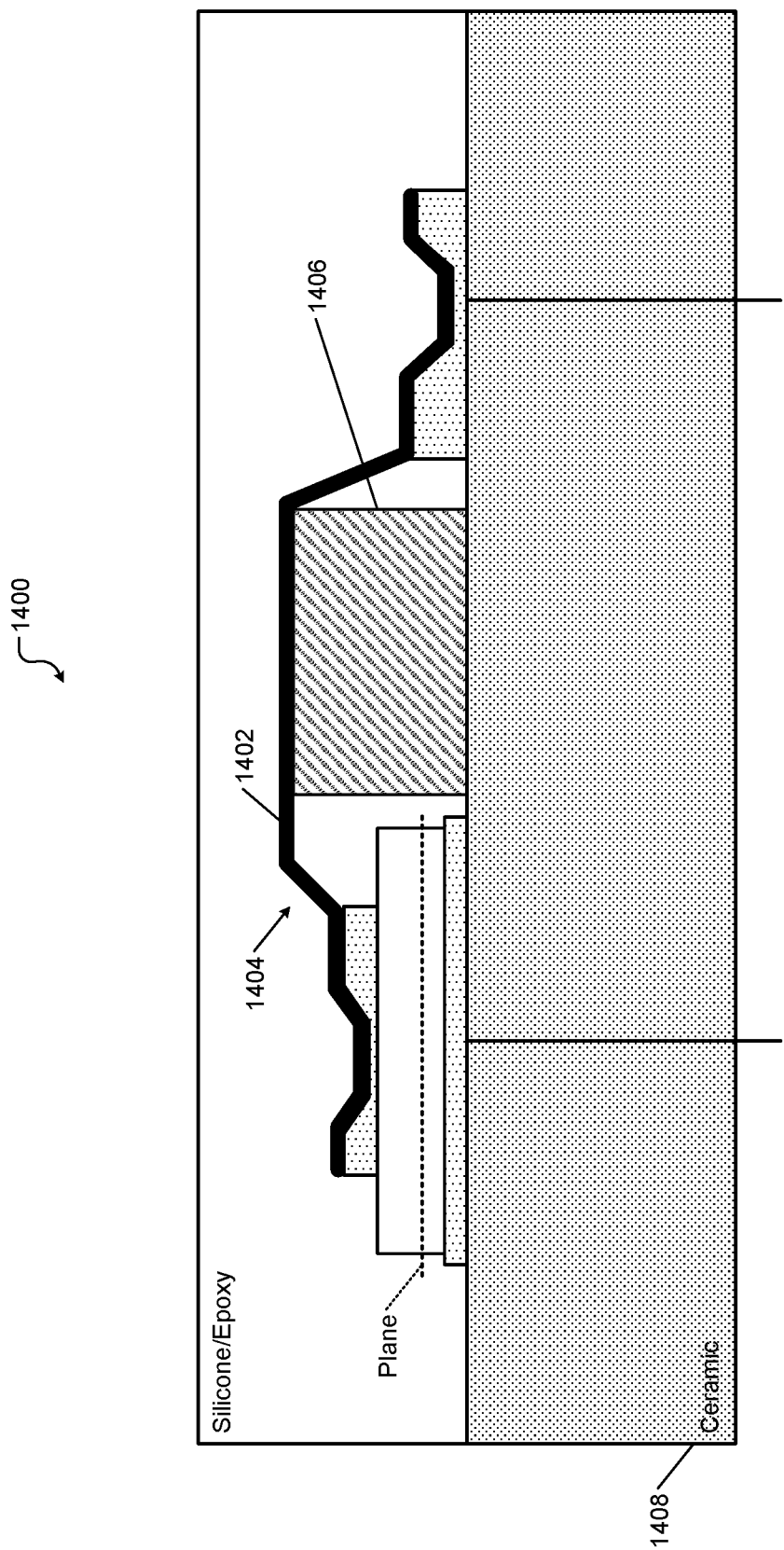
FIG. 14 shows a fifth diode design according to the present disclosure.

FIG. 14 shows a fifth diode design 1400 according to the present disclosure. In the design 1400, the metal strap connector 1402 is bent as shown at 1404 similar to the manner in which the metal strap connector 802 is bent as shown at 804 in FIG. 8 and provides the benefits described with reference to FIG. 8. In addition, a relatively low CTE material (e.g., ceramic) is used as standoff or support 1406 positioned underneath the metal strap connector 1402. Accordingly, only the top portion of the metal strap connector 1402 is encapsulated in the potting material (silicone or epoxy). In some implementations, the ceramic layer 1408 itself can be extended to form the standoff or support 1406. The standoff or support 1406 reduces the thermal stress on the metal strap connector 1402 in the direction from the ceramic layer 1408 to the potting material. While not shown, the standoff or support 1406 may be used in the diode designs shown in FIGS. 5-12.

In some implementations, the metal strap connector shown in FIGS. 7-14 can be formed of a relatively low CTE material such as that used to form the thin plate 702 shown in FIG. 7. For example, the low CTE material used to form the metal strap connector shown in FIGS. 7-14 can comprise W—Cu, W—Mo, or a similar alloy.

FIGS. 15 and 16 show that in some implementations, wire bonding can be used instead of the metal strap connector. FIG. 15 shows a sixth design 1500 comprising a bonding wire 1502 used to connect the anode of the silicon die 1504 to the power return line R. FIG. 16 shows a top view 1600 of the design 1500 showing a plurality of bonding wires 1602 used to connect the anode of the silicon die 1604 to the power return line R.

The encapsulation or the potting material can be silicone or epoxy. This design significantly reduces thermal stress on the diode at high temperatures since there is a significant reduction in the chances of solder reflow to the edge of the silicon die 1604 (i.e., solder reflow is nearly non-existent). Further, using a plurality of bonding wires increases flexibility at high temperatures, which reduces local thermal stress on the silicon die 1604.

FIGS. 17-21 show additional examples of optimal shapes for the metal strap connector that increase the flexibility of the metal strap connector, which reduces local thermal stress on the diode. These optimal shapes prevent the solder material that bonds the silicon die to the metal strap connector from reaching the edge of the silicon die and forming a high stress point where cracking can initiate at high temperatures. These optimal shapes may be used in the diode designs shown in FIGS. 5-14.

FIG. 17 shows a top view of a metal strap connector 1700 with one or more slits 1702. The one or more slits 1702 increase flexibility at high temperatures, which reduces local thermal stress on the diode. The one or more slits 1702 extend along the length of the metal strap connector 1700. The one or more slits 1702 terminate at a first distance from a first end of the metal strap connector 1700 and at a second distance from a second end from the metal strap connector 1700.

FIG. 18 shows a top view of an S-shaped metal strap connector 1800. Only a portion of the metal strap connector 1800 is s-shaped. The S-shape extends along the length of the metal strap connector 1800. The S-shape terminates at a first distance from a first end of the metal strap connector 1800 and at a second distance from a second end from the metal strap connector 1800.

FIG. 19 shows a top view of a wave-shaped metal strap connector 1900. The wave shape extends along the length of the metal strap connector 1900. The wave shape terminates at a first distance from a first end of the metal strap connector 1900 and at a second distance from a second end from the metal strap connector 1900.

Figure 20:
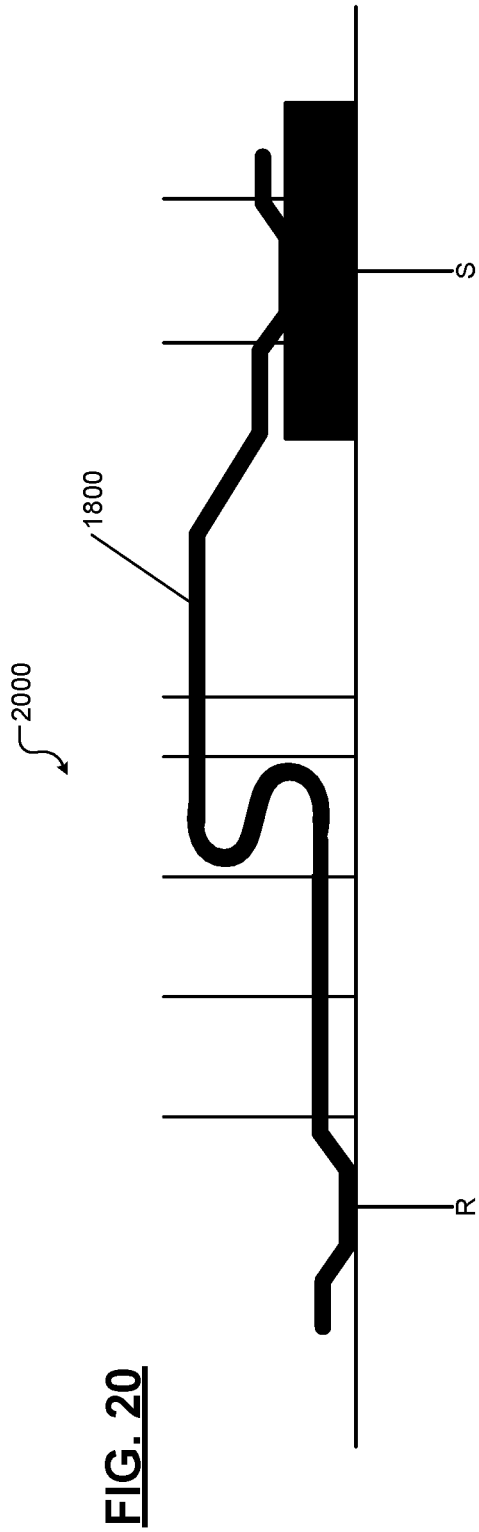
Figure 21:
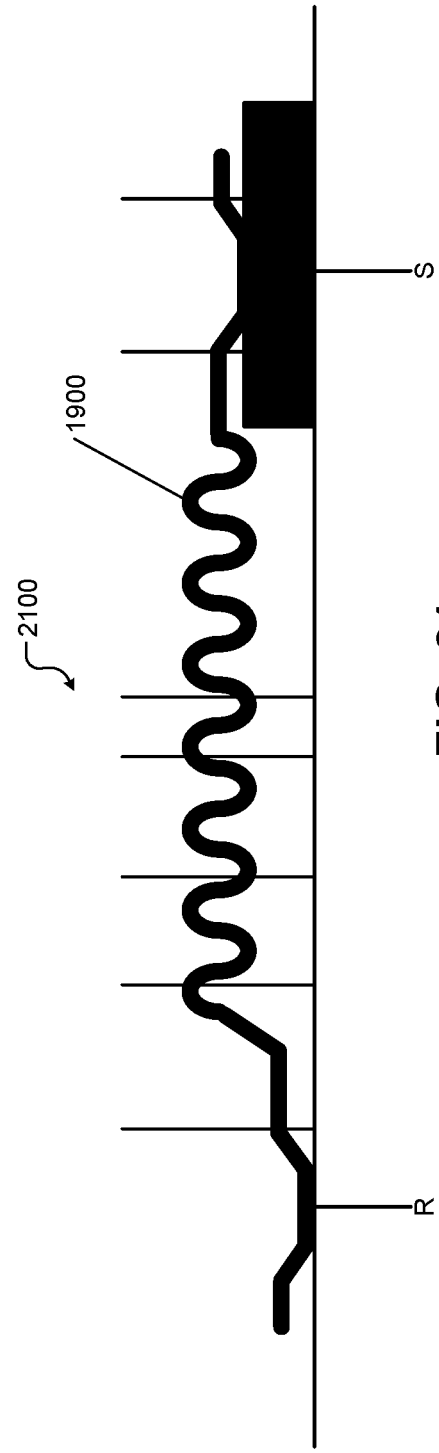

FIG. 20 shows a side view 2000 of the S-shaped metal strap connector 1800. FIG. 21 shows a side view of the wave-shaped metal strap connector 1900. Additional shapes and configurations for the metal strap connector are contemplated.

In general, the use of the metal strap connector with optimal shapes prevents formation of a high stress point on the silicon die surface (as initiation location of cracking) by preventing the solder material from reaching the mechanical weak point of the bare silicon die. The shape of the metal strap connector can be used to control the reflow profile of the solder layer, reduce manufacturing variability, and achieve predictable component lifetime.

It should be noted that the various diode designs disclosed herein are not limited implementing only diodes in the substrate support. Rather, the designs can be extended to implementing any semiconductor bare die component embedded in a substrate support ceramic assembly. Examples of the semiconductor bare die components include diodes, transistors, solid state sensors, etc.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a plasma chamber, comprising:
   a base plate;
   a first layer arranged on the base plate, the first layer having a first electrical contact and a second electrical contact and being made of an electrical insulating material;
   a plurality of heating elements arranged in the first layer; and
   a plurality of diodes arranged in respective cavities in the first layer, the plurality of diodes connected in series to the plurality of heating elements, respectively;
   wherein each of the plurality of diodes comprises a die of a semiconductor material arranged in the corresponding cavity, the semiconductor material having a first coefficient of thermal expansion, and the die having a first terminal on a first side of the die and a second terminal on a second side of the die that is opposite to the first side, the first side of the die arranged on the first layer along a plane, the first terminal of the die connected to the first electrical contact; and wherein for each of the plurality of diodes, the corresponding cavity further comprises a conductor having a second coefficient of thermal expansion that is greater than the first coefficient of thermal expansion, having a first end connected to the second terminal of the die, having a second end connected to the second electrical contact, and having a first portion adjacent to the first end that deflects away from the second side of the die at an acute angle relative to the plane.

2. The substrate support of claim 1 further comprising a circuit configured to supply power to one of the plurality of heating elements and one of the plurality of diodes connected in series with the one of the plurality of heating elements via the first and second electrical contacts on the first layer.

3. The substrate support of claim 1 further comprising a support having a first surface arranged on the first layer and a second surface on which a second portion of the conductor is arranged, the second portion being between the first portion and the second end of the conductor.

4. The substrate support of claim 1 wherein the conductor comprises copper, a tungsten-copper alloy, or a tungsten-molybdenum alloy.

5. The substrate support of claim 1 wherein the die and the conductor are encapsulated in silicone or epoxy.

6. The substrate support of claim 1 wherein the electrically insulating material comprises a ceramic material and wherein the semiconductor material comprises silicon.

7. The substrate support of claim 1 wherein the conductor includes one or more slits extending along a flat section of the conductor, the one or more slits terminating at a first distance from the first end of the conductor and at a second distance from the second end from the conductor.

8. The substrate support of claim 1 wherein a portion of the conductor has a serpentine shape or a wavy shape, and wherein the portion terminates at a first distance from the first end of the conductor and at a second distance from the second end from the conductor.

9. An apparatus comprising:
a layer having a first electrical contact and a second electrical contact located at a distance from the first electrical contact, the layer being made of an electrically insulating material;
a die comprising a semiconductor material having a first coefficient of thermal expansion and having a first terminal on a first side of the die and a second terminal on a second side of the die that is opposite to the first side, the first side of the die arranged on the layer along a plane, the first terminal of the die connected to the first electrical contact; and
a conductor having a second coefficient of thermal expansion that is greater than the first coefficient of thermal expansion, having a first end connected to the second terminal of the die, having a second end connected to the second electrical contact, and having a first portion adjacent to the first end that deflects away from the second side of the die at an acute angle relative to the plane.

10. The apparatus of claim 9 further comprising a support having a first surface arranged on the layer and a second surface on which a second portion of the conductor is arranged, the second portion being between the first portion and the second end of the conductor.

11. The apparatus of claim 9 wherein the conductor comprises copper, a tungsten-copper alloy, or a tungsten-molybdenum alloy.

12. The apparatus of claim 9 wherein the die and the conductor are encapsulated in silicone or epoxy.

13. The apparatus of claim 9 wherein the electrically insulating material comprises a ceramic material and wherein the semiconductor material comprises silicon.

14. The apparatus of claim 9 wherein the conductor includes one or more slits extending along a flat section of the conductor, the one or more slits terminating at a first distance from the first end of the conductor and at a second distance from the second end from the conductor.

15. The apparatus of claim 9 wherein a portion of the conductor has a serpentine shape or a wavy shape, and wherein the portion terminates at a first distance from the first end of the conductor and at a second distance from the second end from the conductor.

* * * * *